United States Patent
Kim

(10) Patent No.: US 10,770,120 B2
(45) Date of Patent: Sep. 8, 2020

(54) MEMORY SYSTEM AND OPERATING METHOD OF THE SAME

(71) Applicant: SK hynix Inc., Gyeonggi-do (KR)

(72) Inventor: Byung-Jun Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 197 days.

(21) Appl. No.: 16/109,169

(22) Filed: Aug. 22, 2018

(65) Prior Publication Data

US 2019/0252007 A1     Aug. 15, 2019

(30) Foreign Application Priority Data

Feb. 9, 2018 (KR) .................. 10-2018-0016288

(51) Int. Cl.
| | |
|---|---|
| G11C 5/14 | (2006.01) |
| G06F 1/3234 | (2019.01) |
| G06F 1/30 | (2006.01) |
| G11C 16/22 | (2006.01) |

(52) U.S. Cl.
CPC .............. G11C 5/148 (2013.01); G06F 1/30 (2013.01); G06F 1/3275 (2013.01); G11C 5/143 (2013.01); G11C 5/144 (2013.01); G11C 16/225 (2013.01)

(58) Field of Classification Search
CPC ............ G11C 5/148; G11C 5/14; G11C 5/144
See application file for complete search history.

(56) References Cited

U.S. PATENT DOCUMENTS

| | | | |
|---|---|---|---|
| 2018/0285213 A1* | 10/2018 | Kim | ................ G06F 11/1048 |
| 2019/0196743 A1* | 6/2019 | Hsieh | ................ G06F 12/16 |

FOREIGN PATENT DOCUMENTS

| | | |
|---|---|---|
| KR | 101130850 | 3/2012 |
| KR | 1020150082010 | 7/2015 |

\* cited by examiner

*Primary Examiner* — Han Yang
(74) *Attorney, Agent, or Firm* — IP & T Group LLP

(57) ABSTRACT

A memory system includes: a sudden power off (SPO) frequency value calculator suitable for determining a SPO frequency value; a checkpointing mode controller suitable for setting the memory system to one among a high frequency checkpointing mode and a low frequency checkpointing mode according to the SPO frequency value; and a processor suitable for performing a checkpointing operation according to the set frequency checkpointing mode.

19 Claims, 11 Drawing Sheets

FIG. 6

| | Current Value (601) | Weighted Value (602) | Threshold Value (603) |
|---|---|---|---|
| User Type (610) | A (611) | D (612) | G (613) |
| Device Type (620) | B (621) | E (622) | H (623) |
| ... | ... | ... | ... |
| Recently Occurred SPO Count (630) | C (631) | F (632) | I (633) |
| | - | SPO Frequency Value X (642) | Threshold T (643) |

MEMORY SYSTEM AND OPERATING METHOD OF THE SAME

CROSS-REFERENCE TO RELATED APPLICATION(S)

The present application claims priority of Korean Patent Application No. 10-2018-0016288, filed on Feb. 9, 2018, which is incorporated herein by reference in its entirety.

BACKGROUND

1. Field

Various embodiments of the present invention generally relate to a memory system. Particularly, the embodiments relate to a memory system capable of processing data with a memory device, and method of operating the memory system.

2. Description of the Related Art

The computer environment paradigm is transitioning into ubiquitous computing, which enables computing systems to be used anytime and anywhere. As a result, use of portable electronic devices such as mobile phones, digital cameras, and laptop computers has rapidly increased. These portable electronic devices generally use a memory system having one or more memory devices for storing data. The memory system in such devices may be used as a main memory device or an auxiliary memory device.

Memory systems provide excellent stability, durability, high information access speed, and low power consumption since they have no moving parts. Examples of memory systems having such advantages include universal serial bus (USB) memory devices, memory cards having various interfaces, and solid state drives (SSD).

SUMMARY

Various exemplary embodiments of the present invention relate to a memory system and, more particularly, to an operation of checkpointing for a sudden power off (SPO).

In accordance with an embodiment of the present invention, a memory system includes: a sudden power off (SPO) frequency value calculator suitable for determining a SPO frequency value; a checkpointing mode controller suitable for setting the memory system to one among a high frequency checkpointing mode and a low frequency checkpointing mode according to the SPO frequency value; and a processor suitable for performing a checkpointing operation according to the set frequency checkpointing mode.

The checkpointing mode controller may compare the SPO frequency value with a SPO frequency threshold value.

The SPO frequency value calculator may determine the SPO frequency value through a current value and a weighted value of respective calculation factors.

The SPO frequency value calculator may determine the SPO frequency threshold value through a threshold value and a weighted value of respective calculation factors.

The checkpointing mode controller may set the memory system to the high frequency checkpointing mode when the SPO frequency value is greater than or equal to the SPO frequency threshold value.

The checkpointing mode controller may set the memory system to the low frequency checkpointing mode when the SPO frequency value is less than the SPO frequency threshold value.

The calculation factors may include at least one of a user type, a memory device type and a count of recently occurred SPOs.

In accordance with an embodiment of the present invention, an operating method of a memory system, the method includes: determining, by a sudden power off (SPO) frequency value calculator, a SPO frequency value; setting, by a checkpointing mode controller, the memory system to one among a high frequency checkpointing mode and a low frequency checkpointing mode according to the SPO frequency value; and performing, by a processor, a checkpointing operation according to the set frequency checkpointing mode.

The operating method may further include comparing the SPO frequency value with a SPO frequency threshold value.

The determining of the SPO frequency value may be performed through a current value and a weighted value of respective calculation factors.

The determining of the SPO frequency value may be performed through a threshold value and a weighted value of respective calculation factors.

The setting of the memory system may include setting the memory system to the high frequency checkpointing mode when the SPO frequency value is greater than or equal to the SPO frequency threshold value.

The setting of the memory system may include setting the memory system to the low frequency checkpointing mode when the SPO frequency value is less than the SPO frequency threshold value.

The calculation factors may include at least one of a user type, a memory device type and a count of recently occurred SPOs.

In accordance with an embodiment of the present invention, a memory system, includes: a memory device; and a controller suitable for determining an operation mode of the memory system based on an occurrence number of sudden power offs (SPOs) and a type of the memory device, and backing up information required to boot based on the determined operation mode.

The controller may include a SPO frequency value calculator suitable for determining a SPO frequency value as the occurrence number of SPOs based on the occurrence number of SPOs and the type of the memory device; a mode controller suitable for selecting one mode of a high frequency mode and a low frequency mode based on the determined SPO frequency value, and determining the selected one mode as the operation mode; and a processor suitable for backing up the information based on the operation mode.

The mode controller may compare the SPO frequency value with a threshold value, and selects one of both the high frequency mode and the low frequency mode based on the comparison result as the operation mode.

The mode controller may select the high frequency mode to increase a current frequency for the backing up of the information when the SPO frequency value is greater than or equal to the threshold value.

The mode controller may select the low frequency mode to decrease a current frequency for the backing up of the information when the SPO frequency value is less than the threshold value.

BRIEF DESCRIPTION OF THE DRAWINGS

FIG. 6 is a table illustrating a calculating operation of a sudden power off (SPO) frequency value calculator in accordance with an embodiment of the present invention.

DETAILED DESCRIPTION

Figure 1:
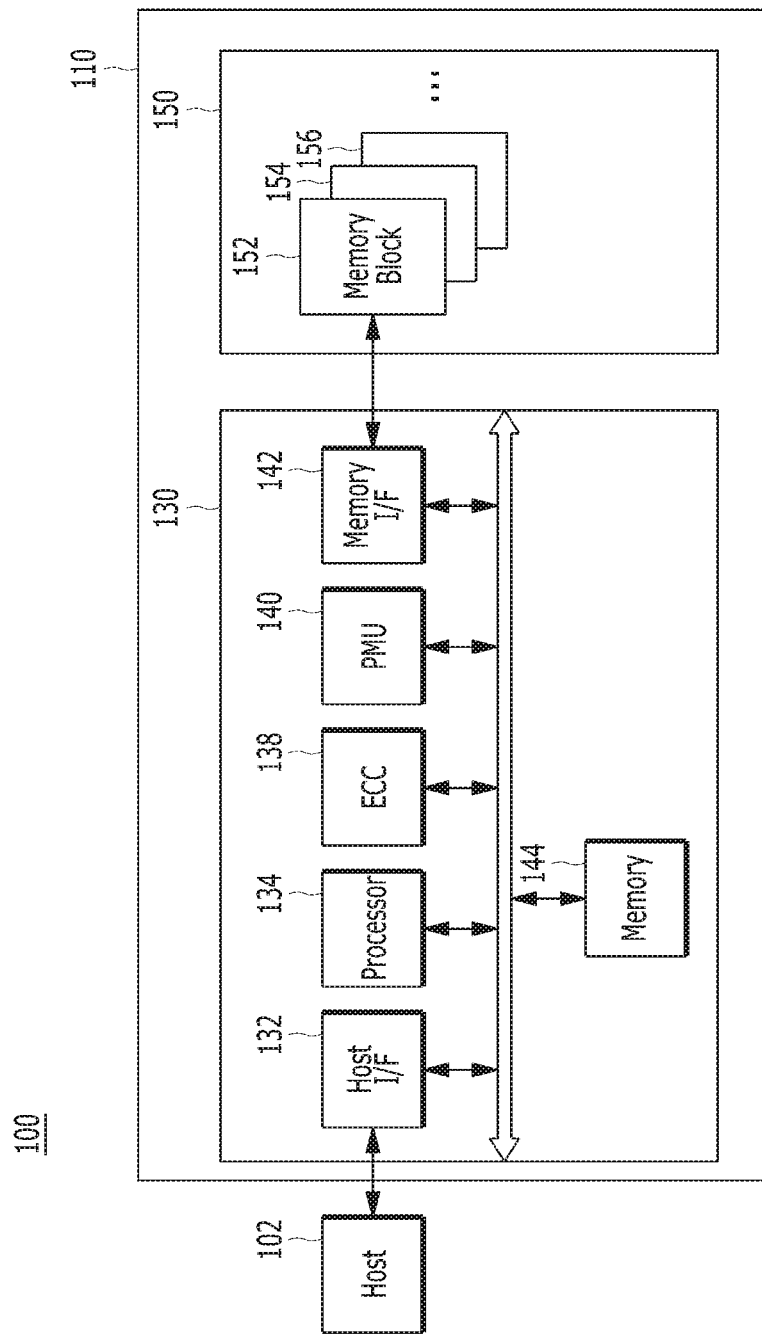
FIG. 1 is a block diagram illustrating a data processing system in accordance with an embodiment of the present invention.

Various embodiments of the present invention are described below in more detail with reference to the accompanying drawings.

We note, however, that the present invention may be embodied in different other embodiments, forms and variations thereof and should not be construed as being limited to the embodiments set forth herein.

Rather, the described embodiments are provided so that this disclosure will be thorough and complete, and will fully convey the present invention to those skilled in the art to which this invention pertains. Throughout the disclosure, like reference numerals refer to like parts throughout the various figures and embodiments of the present invention. It is noted that reference to "an embodiment" does not necessarily mean only one embodiment, and different references to "an embodiment" are not necessarily to the same embodiment(s).

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to clearly illustrate various features of the embodiments.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention. As used herein, singular forms are intended to include the plural forms and vice versa, unless the context clearly indicates otherwise. It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

Hereinafter, the various embodiments of the present invention will be described in detail with reference to the attached drawings.

FIG. 1 is a block diagram illustrating a data processing system 100 including a memory system 110 in accordance with an embodiment of the present invention.

Referring to FIG. 1, the data processing system 100 may include a host 102 operatively coupled to the memory system 110.

The host 102 may include portable electronic devices such as a mobile phone, MP3 player, and laptop computer or non-portable electronic devices such as a desktop computer, a game machine, a television (TV) and a projector.

The host 102 may include at least one operating system (OS), and the OS may manage and control overall functions and operations of the host 102, and provide an operation between the host 102 and a user using the data processing system 100 or the memory system 110. The OS may support functions and operations corresponding to the use purpose and usage of a user. For example, the OS may be divided into a general OS and a mobile OS, depending on the mobility of the host 102. The general OS may be divided into a personal OS and an enterprise OS, depending on the environment of a user. For example, the personal OS configured to support a function of providing a service to general users may include Windows and Chrome, and the enterprise OS configured to secure and support high performance may include Windows server, Linux and Unix. Furthermore, the mobile OS configured to support a function of providing a mobile service to users and a power saving function of a system may include Android, iOS and Windows Mobile. The host 102 may include a plurality of OSs, and execute an OS to perform an operation corresponding to a user's request on the memory system 110. Here, the host 102 may provide a plurality of commands corresponding to a user's request to the memory system 110, and thus the memory system 110 may perform certain operations corresponding to the plurality of commands, that is, corresponding to the user's request.

The memory system 110 may operate to store data for the host 102 in response to a request of the host 102. Non-limiting examples of the memory system 110 may include a solid state drive (SSD), a multi-media card (MMC), a secure digital (SD) card, a universal storage bus (USB) device, a universal flash storage (UFS) device, a compact flash (CF) card, a smart media card (SMC), a personal computer memory card international association (PCMCIA) card, and a memory stick. The MMC may include an embedded MMC (eMMC), reduced size MMC (RS-MMC) and micro-MMC, and the. The SD card may include a mini-SD card and micro-SD card.

The memory system 110 may include various types of storage devices. Non-limiting examples of storage devices included in the memory system 110 may include volatile memory devices such as a DRAM dynamic random access memory (DRAM) and a static RAM (SRAM), and may include nonvolatile memory devices such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), resistive RAM (RRAM or ReRAM) and a flash memory.

The memory system 110 may include a controller 130 and a memory device 150. The memory device 150 may store data for the host 102, and the controller 130 may control data storage into the memory device 150.

The controller 130 and the memory device 150 may be integrated into a single semiconductor device, which may be included in the various types of memory systems as exemplified above. For example, the controller 130 and the memory device 150 may be integrated as one semiconductor device to constitute a solid state drive (SSD). When the memory system 110 is used as an SSD, the operating speed of the host 102 connected to the memory system 110 can be improved. In another example, the controller 130 and the memory device 150 may be integrated as one semiconductor device to constitute a memory card. For example, the controller 130 and the memory device 150 may constitute a memory card such as a personal computer memory card international association (PCMCIA) card, compact flash (CF) card, smart media (SM) card, memory stick, multimedia card (MMC) including reduced size MMC (RS-MMC) and micro-MMC, secure digital (SD) card including mini-SD, micro-SD and SDHC, or universal flash storage (UFS) device.

Non-limiting application examples of the memory system 110 may include a computer, an Ultra Mobile PC (UMPC), a workstation, a net-book, a Personal Digital Assistant (PDA), a portable computer, a web tablet, a tablet computer, a wireless phone, a mobile phone, a smart phone, an e-book, a Portable Multimedia Player (PMP), a portable game machine, a navigation system, a black box, a digital camera, a Digital Multimedia Broadcasting (DMB) player, a 3-dimensional television, a smart television, a digital audio recorder, a digital audio player, a digital picture recorder, a digital picture player, a digital video recorder, a digital video player, a storage device constituting a data center, a device capable of transmitting/receiving information in a wireless environment, one of various electronic devices constituting a home network, one of various electronic devices constituting a computer network, one of various electronic devices constituting a telematics network, a Radio Frequency Identification (RFID) device, or one of various components constituting a computing system.

The memory device 150 may be a nonvolatile memory device and may retain stored data even though power is not supplied. The memory device 150 may store data provided from the host 102 through a write operation, and provide data stored therein to the host 102 through a read operation. In an embodiment, the memory device 150 may include a plurality of memory dies (not shown), each memory may include a plurality of planes (not shown), each plane may include a plurality of memory blocks 152 to 156, each of the memory blocks 152 to 156 may include a plurality of pages, and each of the pages may include a plurality of memory cells coupled to a word line. In an embodiment, the memory device 150 may be a flash memory having a 3-dimensional (3D) stack structure, which will be described in more detail with reference to FIG. 4 below. However, the present invention is not limited to a 3D stack structure. In an embodiment, the memory device 150 may be a flash memory having a 2-dimensional (2D) structure.

The structure of the memory device 150 and the 3D stack structure of the memory device 150 will be described in detail later with reference to FIGS. 2 to 4. Accordingly, overlapping descriptions will be omitted herein.

The controller 130 may control the memory device 150 in response to a request from the host 102. Specifically, the controller may control a read operation, a write operation (also referred to as a program operation), and an erase operation of the memory device 150. For example, the controller 130 may provide data read from the memory device 150 to the host 102, and store data provided from the host 102 into the memory device 150.

The controller 130 may include a host interface (I/F) 132, a processor 134, an error correction code (ECC) component 138, a Power Management Unit (PMU) 140, a memory interface 142 such as a NAND flash controller, and a memory 144 all operatively coupled via an internal bus.

The host interface 132 may process a command and data of the host 102, and may communicate with the host 102 through one or more of various interface protocols such as universal serial bus (USB), multi-media card (MMC), peripheral component interconnect-express (PCI-e or PCIe), small computer system interface (SCSI), serial-attached SCSI (SAS), serial advanced technology attachment (SATA), parallel advanced technology attachment (PATA), enhanced small disk interface (ESDI) and integrated drive electronics (IDE). The host interface 132 may be driven via a firmware, that is, a host interface layer (HIL) for exchanging data with the host 102.

The ECC component 138 may correct error bits of data to be processed by the memory device 150 and may include an ECC encoder and an ECC decoder. The ECC encoder may perform an error correction encoding on data to be programmed into the memory device 150 to generate data to which a parity bit is added. The data including the parity bit may be stored in the memory device 150.

The ECC decoder may detect and correct an error contained in the data read from the memory device 150. In other words, the ECC component 138 may perform an error correction decoding process to the data read from the memory device 150 through an ECC code used during an ECC encoding process. According to a result of the error correction decoding process, the ECC component 138 may output a signal, for example, an error correction success/fail signal. When the number of error bits is more than a threshold value of correctable error bits, the ECC component 138 may not correct the error bits, and may output an error correction fail signal.

The ECC component 138 may perform error correction through a coded modulation such as Low Density Parity Check (LDPC) code, Bose-Chaudhri-Hocquenghem (BCH) code, turbo code, Reed-Solomon code, convolution code, Recursive Systematic Code (RSC), Trellis-Coded Modulation (TCM) and Block coded modulation (BCM).

However, the ECC component 138 is not limited thereto. The ECC component 138 may include all circuits, modules, systems or devices for error correction.

The PMU 140 may provide and manage power of the controller 130.

The memory interface 142 may serve as a memory/storage interface for interfacing the controller 130 and the memory device 150 such that the controller 130 may control the memory device 150 in response to a request from the host 102. When the memory device 150 is a flash memory or specifically a NAND flash memory, the memory interface 142 may be NAND flash controller (NFC) and may generate a control signal for the memory device 150 and process data to be provided to the memory device 150 under the control of the processor 134. The memory interface 142 may work as an interface (e.g., a NAND flash interface) for processing a command and data between the controller 130 and the memory device 150. Specifically, the memory interface 142 may support data transfer between the controller 130 and the memory device 150. The memory interface 142 may be driven via a firmware, that is, a flash interface layer (FIL) for exchanging data with the memory device 150.

The memory 144 may serve as a working memory of the memory system 110 and the controller 130, and store data for driving the memory system 110 and the controller 130. The controller 130 may control the memory device 150 to perform read, write, program, and erase operations in response to a request from the host 102. The controller 130 may provide data read from the memory device 150 to the host 102, may store data provided from the host 102 into the memory device 150. The memory 144 may store data required for the controller 130 and the memory device 150 to perform these operations.

The memory 144 may be embodied by a volatile memory. For example, the memory 144 may be embodied by a static random access memory (SRAM) or a dynamic random access memory (DRAM). The memory 144 may be disposed within or out of the controller 130. FIG. 1 exemplifies the memory 144 disposed within the controller 130. In an embodiment, the memory 144 may be embodied by an external volatile memory having a memory interface transferring data between the memory 144 and the controller 130.

As described above, the memory 144 may include a program memory, a data memory, a write buffer/cache, a read buffer/cache, a data buffer/cache and a map buffer/cache to store data required to perform data write and read operations between the host 102 and the memory device 150 and data required for the controller 130 and the memory device 150 to perform these operations.

The processor 134 may control the overall operations of the memory system 110. The processor 134 may drive firmware to control the overall operations of the memory system 110. The firmware may be referred to as flash translation layer (FTL). Also, the processor 134 may be realized as a microprocessor or a central processing unit (CPU).

For example, the controller 130 may perform an operation requested by the host 102 in the memory device 150 through the processor 134, which is implemented as a microprocessor, a CPU, or the like. In other words, the controller 130 may perform a command operation corresponding to a command received from the host 102.

Herein, the controller 130 may perform a foreground operation as the command operation corresponding to the command received from the host 102. For example, the controller 130 may perform a program operation corresponding to a write command, a read operation corresponding to a read command, an erase operation corresponding to an erase command, and a parameter set operation corresponding to a set parameter command, or a set feature command as a set command.

Also, the controller 130 may perform a background operation on the memory device 150 through the processor 134, which is implemented as a microprocessor or a CPU. Herein, the background operation performed on the memory device 150 may include an operation of copying and processing data stored in some memory blocks among the memory blocks 152 to 156 of the memory device 150 into other memory blocks, e.g., a garbage collection (GC) operation, an operation of performing swapping between the memory blocks 152 to 156 of the memory device 150 or between the data of the memory blocks 152 to 156, e.g., a wear-leveling (WL) operation, an operation of storing the map data stored in the controller 130 in the memory blocks 152 to 156 of the memory device 150, e.g., a map flush operation, or an operation of managing bad blocks of the memory device 150, e.g., a bad block management operation of detecting and processing bad blocks among the memory blocks 152 to 156 included in the memory device 150.

Figure 2:
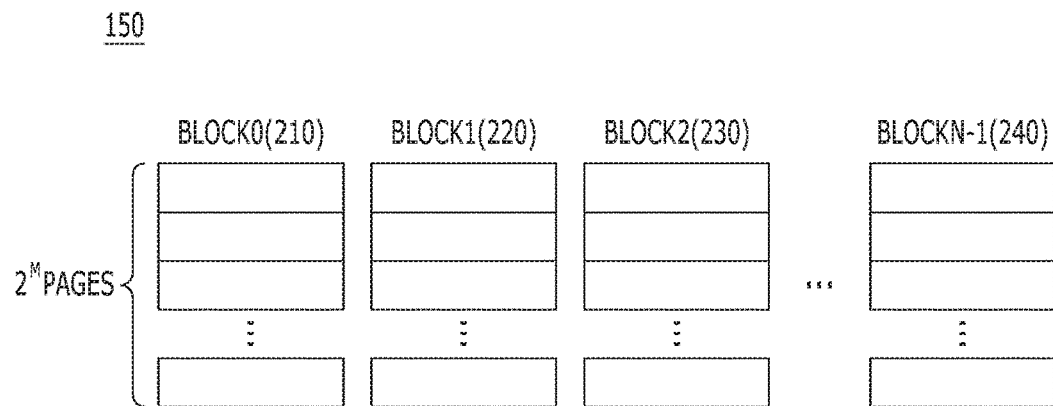
FIG. 2 is a schematic diagram illustrating an exemplary configuration of a memory device employed in a memory system of FIG. 1.

FIG. 2 is a schematic diagram illustrating an exemplary configuration of the memory device 150 employed in the memory system 110 of FIG. 1.

Referring to FIG. 2, the memory device 150 may include a plurality of memory blocks BLOCK0(210) to BLOCKN−1(240), and each of the memory blocks BLOCK0(210) to BLOCKN−1(240) may include a plurality of pages, for example, $2^M$ pages, the number of which may vary depending on circuit design.

Also, memory cells included in the respective memory blocks BLOCK0(210) to BLOCKN−1(240) may be one or more of a single level cell (SLC) memory block storing 1-bit data or a multi-level cell (MLC) memory block storing 2-bit data. Hence, the memory device 150 may include SLC memory blocks or MLC memory blocks, depending on the number of bits which can be expressed or stored in each of the memory cells in the memory blocks. The SLC memory blocks may include a plurality of pages that are embodied by memory cells each storing one-bit data and may generally have high data computing performance and high durability. The MLC memory blocks may include a plurality of pages which are embodied by memory cells each storing multi-bit data (for example, 2 or more bits), and may generally have a larger data storage space than the SLC memory block, that is, higher integration density. In another embodiment, the memory device 150 may include a plurality of triple level cell (TLC) memory blocks. In yet another embodiment, the memory device 150 may include a plurality of quadruple level cell (QLC) memory blocks. The TCL memory blocks may include a plurality of pages which are embodied by memory cells each capable of storing 3-bit data. The QLC memory blocks may include a plurality of pages which are embodied by memory cells each capable of storing 4-bit data. Although the embodiment of the present invention exemplarily describes, for the sake of convenience in description, that the memory device 150 may be the non-volatile memory, it may be implemented by any one of a phase change random access memory (PCRAM), a resistive random access memory (RRAM or ReRAM), a ferroelectrics random access memory (FRAM), and a spin transfer torque magnetic random access memory (STT-RAM or STT-MRAM).

Figure 3:
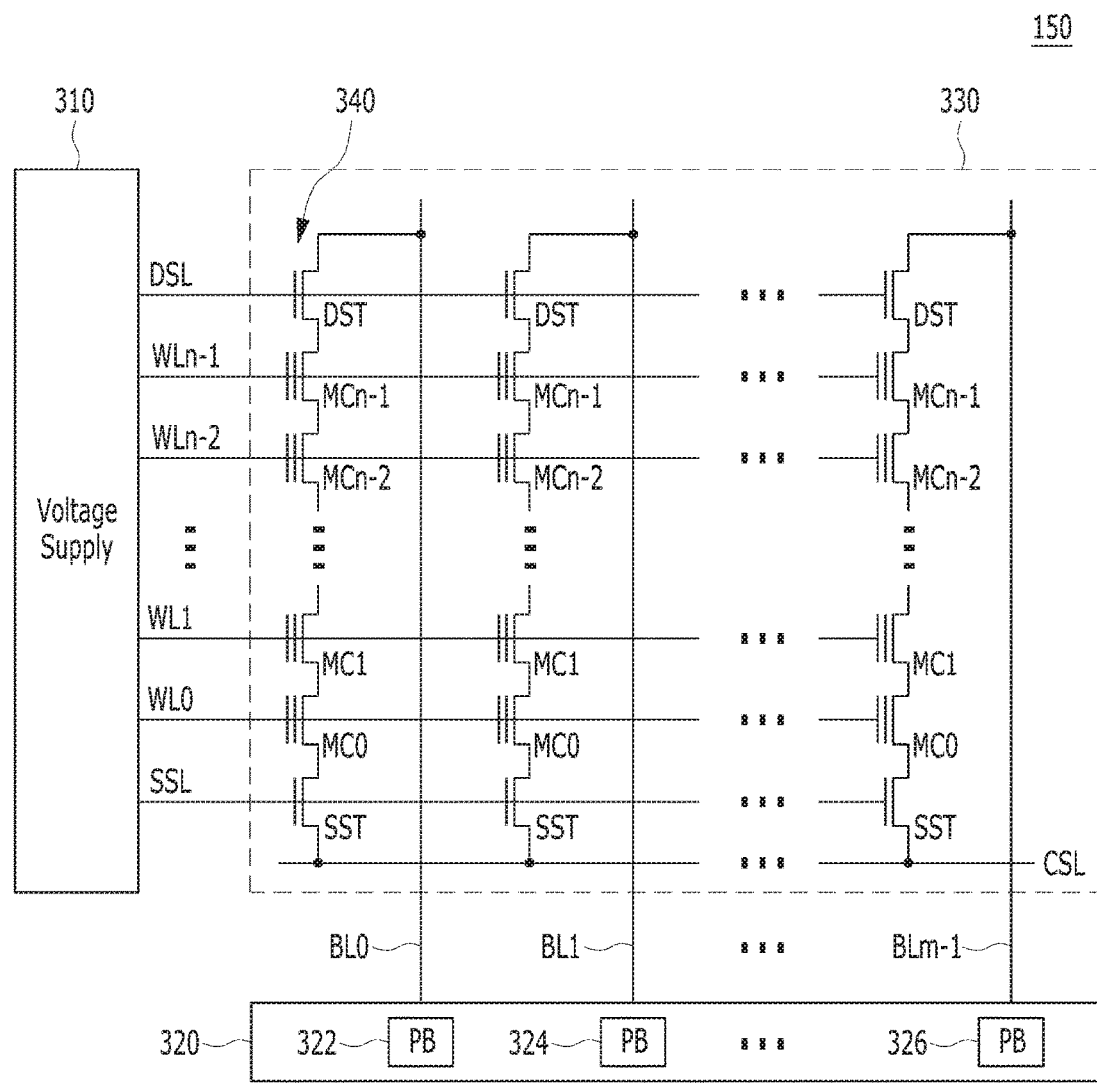
FIG. 3 is a circuit diagram illustrating an exemplary configuration of a memory cell array of a memory block in a memory device shown in FIG. 1.

FIG. 3 is a circuit diagram illustrating an exemplary configuration of a memory cell array of a memory block 330 in the memory device 150. For example, the memory block 330 may correspond to any of the plurality of memory blocks 152 to 156 included in the memory device 150 of the memory system 110.

Referring to FIG. 3, the memory block 330 may include a plurality of cell strings 340 coupled to a plurality of corresponding bit lines BL0 to BLm−1. For reference, in FIG. 3, 'DSL' denotes a drain select line, 'SSL' denotes a source select line, and 'CSL' denotes a common source line. Each cell strings 340 may be electrically coupled to a bit line BL, at least one source select line SSL, at least one ground select line GSL (not shown), a plurality of word lines WL, at least one dummy word line DWL (not shown), and a common source line CSL. The cell string 340 of each column may include one or more drain select transistors DST and one or more source select transistors SST. Between the drain and source select transistors DST and SST, a plurality of memory cells MC0 to MCn−1 may be coupled in series. In an embodiment, each of the memory cell transistors MC0 to MCn−1 may be embodied by an MLC capable of storing data information of a plurality of bits. Each of the cell strings 340 may be electrically coupled to a corresponding bit line among the plurality of bit lines BL0 to BLm−1. For example, as illustrated in FIG. 3, the first cell string is coupled to the first bit line BL0, and the last cell string is coupled to the last bit line BLm−1.

Although FIG. 3 illustrates NAND flash memory cells, the present disclosure is not limited thereto. It is noted that the memory cells may be NOR flash memory cells, or hybrid flash memory cells including two or more types of memory cells combined therein. Also, it is noted that the memory device 150 may be a flash memory device including a conductive floating gate as a charge storage layer or a charge trap flash (CTF) memory device including an insulation layer as a charge storage layer.

The memory device 150 may further include a voltage supply 310 which provides word line voltages including a program voltage, a read voltage, and a pass voltage to supply to the word lines according to an operation mode. The voltage generation operation of the voltage supply 310 may be controlled by a control circuit (not illustrated). Under the control of the control circuit, the voltage supply 310 may select one of the memory blocks (or sectors) of the memory cell array, select one of the word lines of the selected memory block, and provide the word line voltages to the selected word line and the unselected word lines as may be needed.

The memory device 150 may include a read and write (read/write) circuit 320 which is controlled by the control circuit. During a verification/normal read operation, the read/write circuit 320 may operate as a sense amplifier for reading data from the memory cell array. During a program operation, the read/write circuit 320 may operate as a write driver for driving bit lines according to data to be stored in the memory cell array. During a program operation, the read/write circuit 320 may receive from a buffer (not illustrated) data to be stored into the memory cell array, and drive bit lines according to the received data. The read/write circuit 320 may include a plurality of page buffers 322 to 326 respectively corresponding to columns (or bit lines) or column pairs (or bit line pairs), and each of the page buffers 322 to 326 may include a plurality of latches (not illustrated).

Figure 4:
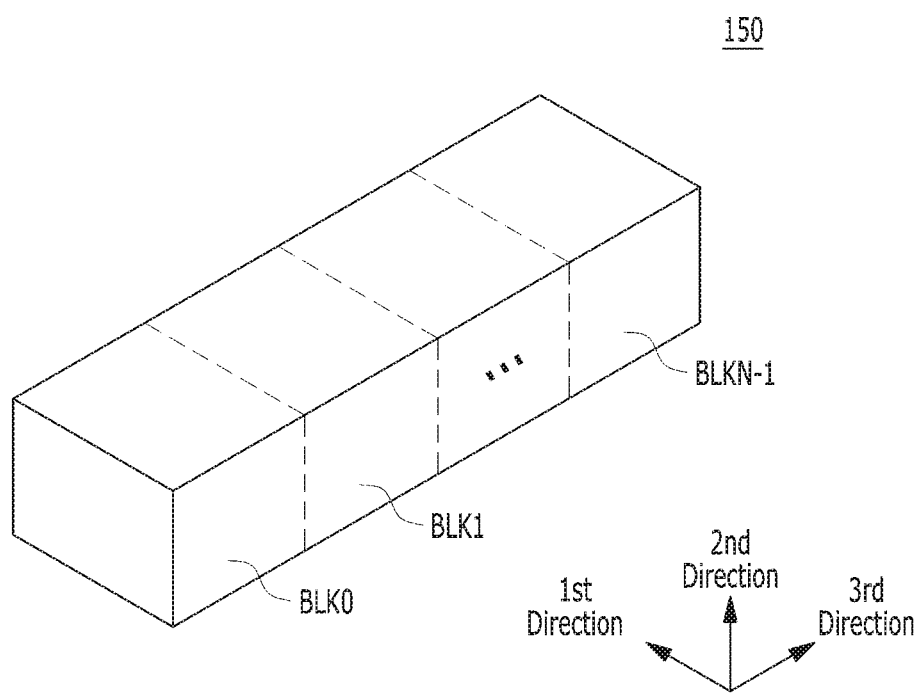
FIG. 4 is a schematic diagram illustrating an exemplary structure of the memory device.

FIG. 4 is a schematic diagram illustrating an exemplary structure of the memory device 150.

The memory device 150 may be embodied by a two-dimensional (2D) or three-dimensional (3D) memory device.

Particularly, as illustrated in FIG. 4, the memory device 150 may be embodied by a nonvolatile memory device having a 3D stack structure. When the memory device 150 has a 3D structure, the memory device 150 may include a plurality of memory blocks BLK0 to BLKN−1 each having a 3D structure (or vertical structure).

Hereafter, a data processing operation for a memory device, particularly, a data processing operation performed when a plurality of command operations corresponding to a plurality of commands received from the host 102 are performed, in a memory system in accordance with an embodiment of the present invention, will be described in detail with reference to FIGS. 5 to 7.

Figure 5:
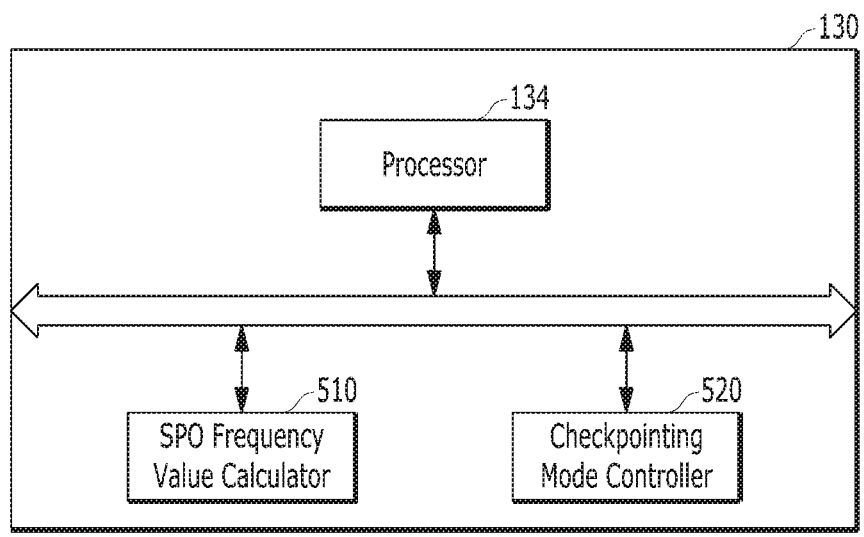
FIG. 5 is a diagram schematically illustrating a memory controller in accordance with an embodiment of the present invention.

FIG. 5 is a diagram schematically illustrating a memory controller 130 in accordance with an embodiment of the present invention.

Referring to FIG. 5, the controller 130 may include the processor 134, a sudden power off (SPO) frequency value calculator 510, and a checkpointing mode controller 520.

As described above in FIG. 1, the processor 134 may drive firmware referred to as a flash translation layer (FTL) for controlling overall operations of the memory system 110. The processor 134 may be implemented as one among a microprocessor, a central processing unit (CPU) and so forth.

Occurrence frequency of SPO may vary due to users, use purpose, and/or types of the memory system 110.

In order to prepare for the occurrence of SPO, the processor 134 may periodically perform operations of driving the FTL and backing up in advance information required to boot, among various operations.

Hereinafter, the operation of backing up the information may be referred to as a checkpointing operation.

The checkpointing operation may be periodically performed. A period of the checkpointing operation may be optimally determined for an optimal checkpointing operation.

Generally, the period of the checkpointing operation may be predetermined to a fixed value.

However, the period of the checkpointing operation may vary according to environment of a memory system, such as users, use purpose, and/or types of the memory system. Also, in the memory system, SPO may frequently occur during a particular time and may occasionally occur during another particular time.

Therefore, in order to maximize optimal result of the checkpointing operation, the period of the checkpointing operation is required to be dynamically adjusted according to environment of the memory system, such as users, use purpose, and/or types of the memory system.

For example, the period of the checkpointing operation is required to be shorter, that is, operation frequency of the checkpointing operation is required to be greater for users, use purpose, and/or types when it is predicted that SPO will occur often in a memory system.

For another example, the period of the checkpointing operation is required to be greater, that is, operation frequency of the checkpointing operation is required to be lesser for users, use purpose, and/or types when it is predicted that SPO will occur rarely in a memory system.

The SPO frequency value calculator 510 may calculate a SPO frequency value and a threshold value. The SPO frequency value may be compared with the threshold value.

The checkpointing mode controller 520 may set the memory system 110 to one between a high frequency checkpointing mode and a low frequency checkpointing mode by comparing the SPO frequency value with the threshold value.

In detail, the checkpointing mode controller 520 may set the memory system 110 to the high frequency checkpointing mode when the SPO frequency value is greater than or equal to the threshold value. The checkpointing mode controller 520 may set the memory system 110 to the low frequency checkpointing mode when the SPO frequency value is less than the threshold value.

In the high frequency checkpointing mode, the processor 134 may perform the checkpointing operation with a high frequency. In the low frequency checkpointing mode, the processor 134 may perform the checkpointing operation with a low frequency.

The SPO frequency value calculator 510 and the checkpointing mode controller 520 may operate based on the FTL driven by the processor 134, which is merely a non-limiting example. In an embodiment, the SPO frequency value calculator 510 and the checkpointing mode controller 520 may operate Independently. In an embodiment, the processor 134 may perform a checkpointing operation. In another embodiment, an independent checkpointing component (not illustrated) may perform a checkpointing operation.

FIG. 6 is a table illustrating a calculating operation of the SPO frequency value calculator 510 in accordance with an embodiment of the present invention.

Referring to FIG. 6, the SPO frequency value calculator 510 may include a calculation table 600. The calculation table 600 used by the SPO frequency value calculator 510 may include factors for calculating the SPO frequency value and the threshold value.

In detail, the calculation table 600 may include, but not limited to, a first field for a user type 610, a second field for a memory device type 620, and a third field for a count value of recently occurred SPOs 630 as calculation factors. Non-limiting embodiments of the calculation table 600 may include calculation factors such as users, use purpose, and/or types of a memory system 110.

The calculation table 600 may include a field for a current value 601, a field for a weighted value 602, and a field for a threshold value 603 for each of calculation factors (i.e., the user type 610, the memory device type 620, and the count of recently occurred SPOs 630).

The current value 601 may represent each current status of the calculation factors (i.e., the user type 610, the memory device type 620, and the count of recently occurred SPOs 630). For a user determined as frequently incurring SPO, the current value "A" 611 of the user type 610 may be high. For a user determined as rarely incurring SPO, the current value "A" 611 of the user type 610 may be low.

For a device determined as frequently incurring SPO, the current value "B" 621 of the memory device type 620 may be high.

For a device determined as rarely incurring SPO, the current value "B" 621 of the memory device type 620 may be low.

The count of recently occurred SPOs 630 may represent an occurrence number of recent SPOs. Therefore, the count of recently occurred SPOs 630 may be a calculation factor most closely related to the calculation of the SPO frequency value and the threshold value.

The calculation table 600 may have the weighted value 602 assigned to each of the calculation factors (i.e., the user type 610, the memory device type 620 and the count of recently occurred SPOs 630) according to importance of the respective calculation factors (i.e., the user type 610, the memory device type 620, and the count of recently occurred SPOs 630).

For example, the weighted value "F" 632 for the count of recently occurred SPOs 630 may be the greatest value since the count of recently occurred SPOs 630 is a calculation factor most closely related to the calculation of the SPO frequency value and the threshold value.

In contrast, when any particular one of the calculation factors (i.e., the user type 610, the memory device type 620, and the count of recently occurred SPOs 630) cannot be used in the calculation of the SPO frequency value and the threshold value, the weighted value for the particular calculation factor may be zero (0).

The threshold value 603 may be compared with the current value 601 of the respective calculation factors (i.e., the user type 610, the memory device type 620, and the count of recently occurred SPOs 630). The threshold value 603 may be an average value of the respective calculation factors (i.e., the user type 610, the memory device type 620 and the count of recently occurred SPOs 630).

The threshold value "G" 613 may indicate an adequate value of the "A" 611 of the current value 601 of the calculation factor (i.e., the user type 610). The threshold value "H" 623 may indicate an adequate value of the "B" 621 of the current value 601 of the calculation factor (i.e., the memory device type 620). The threshold value "I" 633 may indicate an adequate value of the "C" 631 of the current value 601 of the calculation factor (i.e., the count of recently occurred SPOs 630).

The SPO frequency value of "X" 642 may be sum of multiplications of the current value 601 and the weighted value 602 for the respective calculation factors (i.e., the user type 610, the memory device type 620, and the count of recently occurred SPOs 630).

The threshold value of "T" 643 may be sum of multiplication of the threshold value 603 and the weighted value 602 for the respective calculation factors (i.e., the user type 610, the memory device type 620, and the count of recently occurred SPOs 630).

The checkpointing mode controller 520 of FIG. 5 may set the memory system 110 to one between the high frequency checkpointing mode and the low frequency checkpointing mode by comparing the SPO frequency value "X" 642 with the threshold value "T" 643.

In detail, the checkpointing mode controller 520 may set the memory system 110 to the high frequency checkpointing mode when the SPO frequency value "X" 642 is greater than or equal to the threshold value "T" 643. The checkpointing mode controller 52 may set the memory system 110 to the low frequency checkpointing mode when the SPO frequency value "X" 642 is less than the threshold value "T" 643.

In the high frequency checkpointing mode, the processor 134 may perform the checkpointing operation with a high frequency. In the low frequency checkpointing mode, the processor 134 may perform the checkpointing operation with a low frequency.

Figure 7:
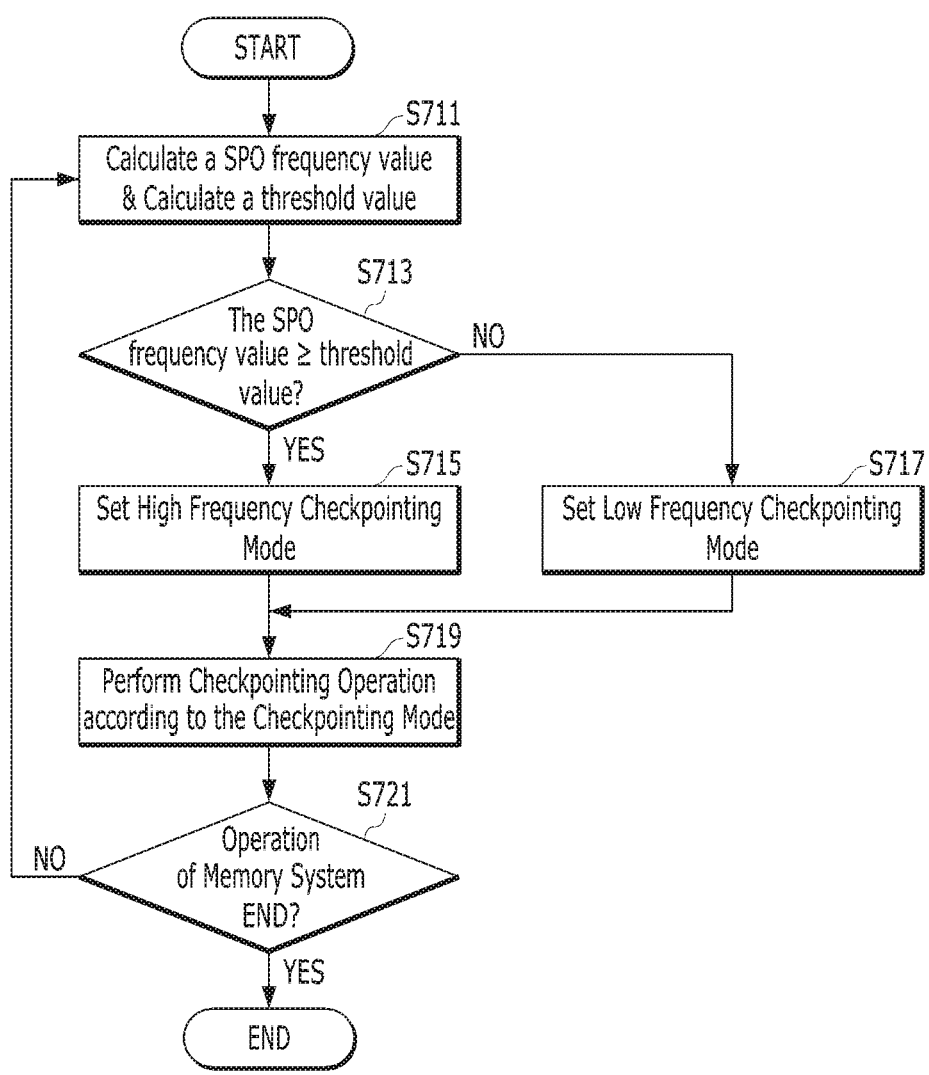
FIG. 7 is a flowchart schematically illustrating an operation of the memory system in accordance with an embodiment of the present invention.

FIG. 7 is a flowchart schematically illustrating an operation of a memory system, for example, the memory system 110 including the memory controller 130 of FIG. 5, in accordance with an embodiment of the present invention.

At step S711, the SPO frequency value calculator 510 may calculate the SPO frequency value and the threshold value. The SPO frequency value may be compared with the threshold value.

At step S713, the checkpointing mode controller 520 may set the memory system 110 to one between a high frequency checkpointing mode and a low frequency checkpointing mode by comparing the SPO frequency value with the threshold value.

At step S715, the checkpointing mode controller 520 may set the memory system 110 to the high frequency checkpointing mode when the SPO frequency value is greater than or equal to the threshold value (that is, "YES" at step S713).

At step S717, the checkpointing mode controller 520 may set the memory system 110 to the low frequency checkpointing mode when the SPO frequency value is less than the threshold value (that is, "NO" at step S717).

At step S719, the processor 134 may perform a checkpointing operation according to the set frequency checkpointing mode. In the high frequency checkpointing mode, the processor 134 may perform the checkpointing operation with a high frequency. In the low frequency checkpointing mode, the processor 134 may perform the checkpointing operation with a low frequency.

At step S721, the processor 134 may determine whether the memory system 110 is in a status requiring no checkpointing operation such as a system halt.

When the memory system 110 is determined as in a status requiring a checkpointing operation at step S721 (that is, "NO" at step S721), the processor 134 may repeat the above described steps from step S711. When the memory system 110 is determined as in a status requiring no checkpointing operation (that is, "YES" at step S721), the operation may end.

FIGS. 8 to 16 are diagrams schematically illustrating application examples of the data processing system of FIGS. 1 to 7 according to various embodiments.

Figure 8:
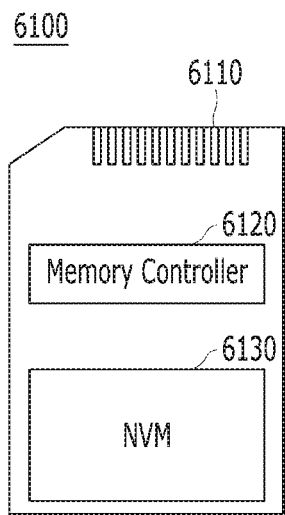
FIGS. 8 to 16 are diagrams schematically illustrating application examples of the data processing system, in accordance with various embodiments of the present invention.

FIG. 8 is a diagram schematically illustrating an example of the data processing system including the memory system in accordance with the present embodiment. FIG. 8 schematically illustrates a memory card system 6100 to which the memory system in accordance with the present embodiment is applied.

Referring to FIG. 8, the memory card system 6100 may include a memory controller 6120, a memory device 6130 and a connector 6110.

More specifically, the memory controller 6120 may be connected to the memory device 6130 embodied by a nonvolatile memory (NVM), and configured to access the memory device 6130.

For example, the memory controller 6120 may be configured to control read, write, erase and background operations of the memory device 6130. The memory controller 6120 may be configured to provide an interface between the memory device 6130 and a host (not shown), and drive firmware for controlling the memory device 6130. That is, the memory controller 6120 may correspond to the controller 130 of the memory system 110 described with reference to FIGS. 1 to 6, and the memory device 6130 may correspond to the memory device 150 of the memory system 110 described with reference to FIGS. 1 to 6.

Thus, as shown in FIG. 1, the memory controller 6120 may include a random access memory (RAM), a processor, a host interface, a memory interface and an error correction code component. The memory controller 130 may further include the elements described in FIGS. 1 and 6.

The memory controller 6120 may communicate with an external device, for example, the host 102 of FIG. 1 through the connector 6110. For example, as described with reference to FIG. 1, the memory controller 6120 may be configured to communicate with an external device through one or more of various communication protocols such as universal serial bus (USB), multimedia card (MMC), embedded MMC serial bus (eMMC), peripheral component interconnection (PCI), PCI express (PCIe), Advanced Technology Attachment (ATA), Serial-ATA, Parallel-ATA, small computer system interface (SCSI), enhanced small disk interface (EDSI), Integrated Drive Electronics (IDE), Firewire, universal flash storage (UFS), wireless fidelity (Wi-Fi or WiFi) and Bluetooth. Thus, the memory system and the data processing system in accordance with the present embodiment may be applied to wired and/or wireless electronic devices or particularly mobile electronic devices.

The memory device 6130 may be implemented by a nonvolatile memory. For example, the memory device 6130 may be implemented by various nonvolatile memory devices such as an erasable and programmable ROM (EPROM), an electrically erasable and programmable ROM (EEPROM), a NAND flash memory, a NOR flash memory, a phase-change RAM (PRAM), a resistive RAM (ReRAM), a ferroelectric RAM (FRAM) and a spin torque transfer magnetic RAM (STT-RAM). The memory device 6130 may include a plurality of dies as in the memory device 150 of FIG. 5.

The memory controller 6120 and the memory device 6130 may be integrated into a single semiconductor device. For example, the memory controller 6120 and the memory device 6130 may construct a solid state drive (SSD) by being integrated into a single semiconductor device. Also, the memory controller 6120 and the memory device 6130 may construct a memory card such as a PC card (e.g., Personal Computer Memory Card International Association (PCM-CIA)), a compact flash (CF) card, a smart media card (e.g., SM and SMC), a memory stick, a multimedia card (e.g., MMC, RS-MMC, MMCmicro and eMMC), a secured digital (SD) card (e.g., SD, miniSD, microSD and SDHC) and a universal flash storage (UFS).

Figure 9:
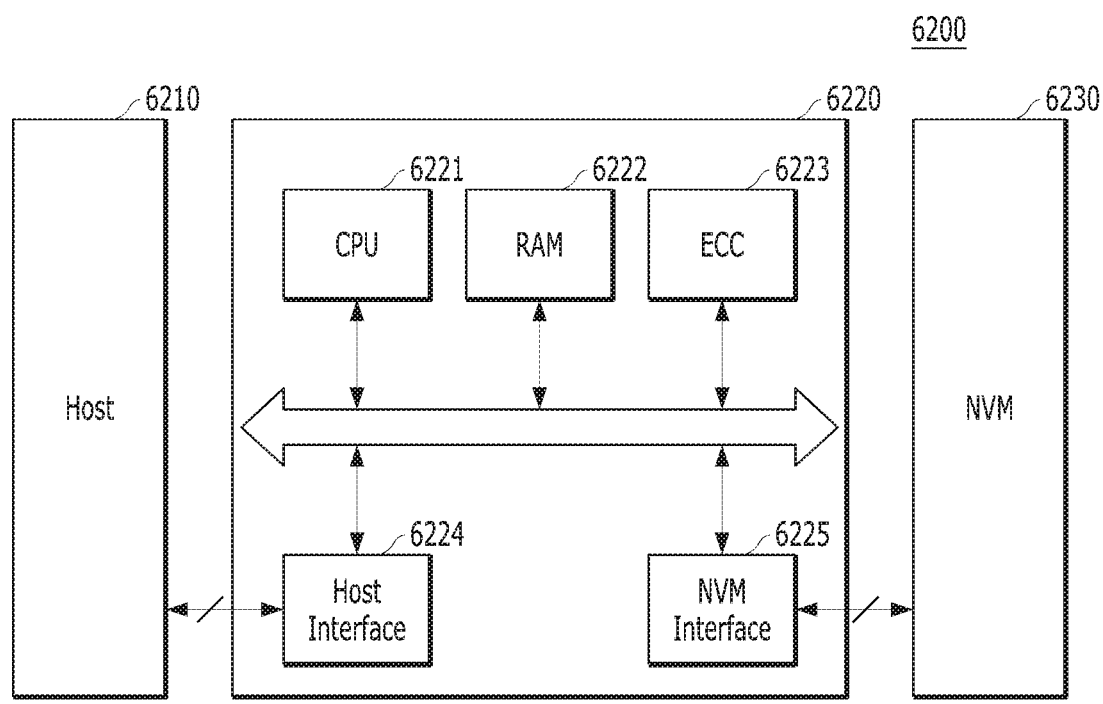

FIG. 9 is a diagram schematically illustrating another example of a data processing system 6200 including a memory system, in accordance with the present embodiment.

Referring to FIG. 9, the data processing system 6200 may include a memory device 6230 having one or more nonvolatile memories (NVMs) and a memory controller 6220 for controlling the memory device 6230. The data processing system 6200 may serve as a storage medium such as a memory card (CF, SD, micro-SD or the like) or USB device, as described with reference to FIG. 1. The memory device 6230 may correspond to the memory device 150 in the memory system 110 described in FIGS. 1 to 6, and the memory controller 6220 may correspond to the controller 130 in the memory system 110 described in FIGS. 1 to 6.

The memory controller 6220 may control a read, write or erase operation on the memory device 6230 in response to a request of the host 6210, and the memory controller 6220 may include one or more central processing units (CPUs) 6221, a buffer memory such as a random access memory (RAM) 6222, an error correction code (ECC) circuit 6223, a host interface 6224 and a memory interface such as an NVM interface 6225.

The CPU 6221 may control the operations on the memory device 6230, for example, read, write, file system management and bad page management operations. The RAM 6222 may be operated according to control of the CPU 6221, and used as a work memory, buffer memory or cache memory. When the RAM 6222 is used as a work memory, data processed by the CPU 6221 may be temporarily stored in the RAM 6222. When the RAM 6222 is used as a buffer memory, the RAM 6222 may be used for buffering data transmitted to the memory device 6230 from the host 6210 or transmitted to the host 6210 from the memory device 6230. When the RAM 6222 is used as a cache memory, the RAM 6222 may assist the memory device 6230 to operate at high speed.

The ECC circuit 6223 may correspond to the ECC component 138 of the controller 130 illustrated in FIG. 1. As described with reference to FIG. 1, the ECC circuit 6223 may generate an error correction code (ECC) for correcting a fail bit or error bit of data provided from the memory device 6230. The ECC circuit 6223 may perform error correction encoding on data provided to the memory device 6230, thereby forming data with a parity bit. The parity bit may be stored in the memory device 6230. The ECC circuit 6223 may perform error correction decoding on data outputted from the memory device 6230. At this time, the ECC circuit 6223 may correct an error using the parity bit. For example, as described with reference to FIG. 1, the ECC circuit 6223 may correct an error using Low Density Parity Check (LDPC) code, Bose-Chaudhri-Hocquenghem (BCH) code, turbo code, Reed-Solomon code, convolution code, Recursive Systematic Code (RSC) or coded modulation such as Trellis-Coded Modulation (TCM) or Block coded modulation (BCM).

The memory controller 6220 may transmit and/or receive data to and/or from the host 6210 through the host interface 6224, and transmit/receive data to/from the memory device 6230 through the NVM interface 6225. The host interface 6224 may be connected to the host 6210 through a parallel advanced technology attachment (PATA) bus, serial advanced technology attachment (SATA) bus, small computer system interface (SCSI), universal serial bus (USB), peripheral component interconnect-express (PCIe) or NAND interface.

The memory controller 6220 may have a wireless communication function with a mobile communication protocol such as wireless fidelity (WiFi) or Long Term Evolution (LTE). The memory controller 6220 may be connected to an external device, for example, the host 6210 or another external device, and then transmit and/or receive data to and/or from the external device. In particular, as the memory controller 6220 is configured to communicate with the external device through one or more of various communication protocols, the memory system and the data processing system in accordance with the present embodiment may be applied to wired and/or wireless electronic devices or particularly a mobile electronic device.

Figure 10:
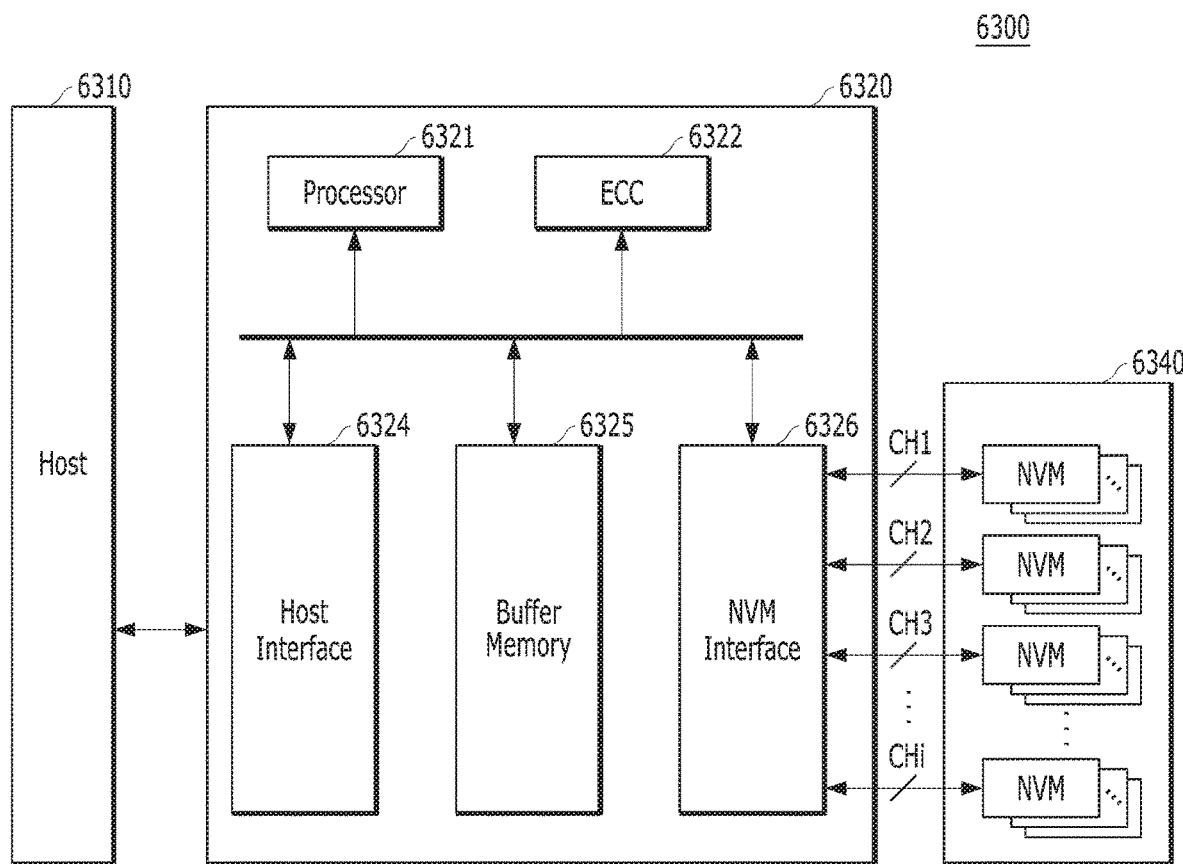

FIG. 10 is a diagram schematically illustrating another example of the data processing system including the memory system in accordance with the present embodiment. FIG. 10 schematically illustrates a solid state drive (SSD) 6300 to which the memory system in accordance with the present embodiment is applied.

Referring to FIG. 10, the SSD 6300 may include a controller 6320 and a memory device 6340 including a plurality of nonvolatile memories (NVMs). The controller 6320 may correspond to the controller 130 in the memory system 110 of FIGS. 1 and 6, and the memory device 6340 may correspond to the memory device 150 in the memory system of FIGS. 1 and 6.

More specifically, the controller 6320 may be connected to the memory device 6340 through a plurality of channels CH1 to CHi. The controller 6320 may include one or more processors 6321, an error correction code (ECC) circuit 6322, a host interface 6324, a buffer memory 6325 and a memory interface, for example, a nonvolatile memory interface 6326.

The buffer memory 6325 may temporarily store data provided from the host 6310 or data provided from a plurality of flash memories NVM included in the memory device 6340, or temporarily store meta data of the plurality of flash memories NVM, for example, map data including a mapping table. The buffer memory 6325 may be embodied by volatile memories such as dynamic random access memory (DRAM), synchronous DRAM (SDRAM), double data rate (DDR) SDRAM, low power DDR (LPDDR) SDRAM and graphics RAM (GRAM) or nonvolatile memories such as ferroelectric RAM (FRAM), resistive RAM (RRAM or ReRAM), spin-transfer torque magnetic RAM (STT-MRAM) and phase-change RAM (PRAM). For convenience of description, FIG. 9 illustrates that the buffer memory 6325 exists in the controller 6320. However, the buffer memory 6325 may exist outside the controller 6320.

The ECC circuit 6322 may calculate an error correction code (ECC) value of data to be programmed to the memory device 6340 during a program operation, perform an error correction operation on data read from the memory device 6340 based on the ECC value during a read operation, and perform an error correction operation on data recovered from the memory device 6340 during a failed data recovery operation.

The host interface 6324 may provide an interface function with an external device, for example, the host 6310, and the nonvolatile memory interface 6326 may provide an interface function with the memory device 6340 connected through the plurality of channels.

Furthermore, a plurality of SSDs 6300 to which the memory system 110 of FIGS. 1 and 6 is applied may be provided to embody a data processing system, for example, a redundant array of independent disk (RAID) system. At this time, the RAID system may include the plurality of SSDs 6300 and a RAID controller for controlling the plurality of SSDs 6300. When the RAID controller performs a program operation in response to a write command provided from the host 6310, the RAID controller may select one or more memory systems or SSDs 6300 according to a plurality of RAID levels, that is, RAID level information of the write command provided from the host 6310 in the SSDs 6300, and output data corresponding to the write command to the selected SSDs 6300. Furthermore, when the RAID controller performs a read command in response to a read command provided from the host 6310, the RAID controller may select one or more memory systems or SSDs 6300 according to a plurality of RAID levels, that is, RAID level information of the read command provided from the host 6310 in the SSDs 6300, and provide data read from the selected SSDs 6300 to the host 6310.

Figure 11:
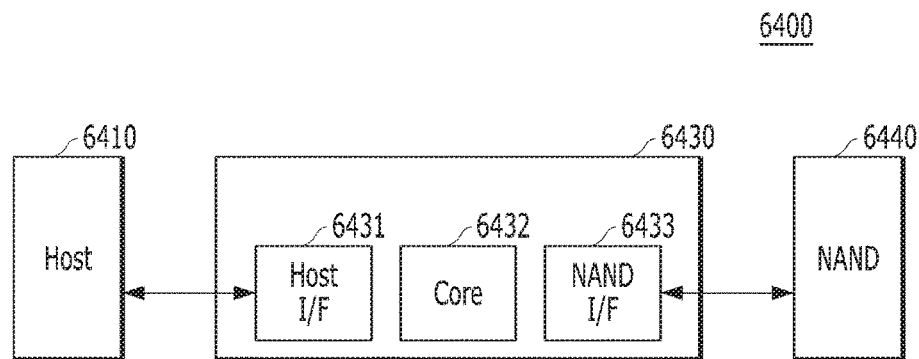

FIG. 11 is a diagram schematically illustrating another example of the data processing system including the memory system in accordance with an embodiment. FIG. 11 schematically illustrates an embedded Multi-Media Card (eMMC) 6400 to which the memory system in accordance with an embodiment is applied.

Referring to FIG. 11, the eMMC 6400 may include a controller 6430 and a memory device 6440 embodied by one or more NAND flash memories. The controller 6430 may correspond to the controller 130 in the memory system 110 of FIGS. 1 and 6, and the memory device 6440 may correspond to the memory device 150 in the memory system 110 of FIGS. 1 and 6.

More specifically, the controller 6430 may be connected to the memory device 6440 through a plurality of channels. The controller 6430 may include one or more cores 6432, a host interface (I/F) 6431 and a memory interface, for example, a NAND interface (I/F) 6433.

The core 6432 may control the operations of the eMMC 6400, the host interface 6431 may provide an interface function between the controller 6430 and the host 6410, and the NAND interface 6433 may provide an interface function between the memory device 6440 and the controller 6430. For example, the host interface 6431 may serve as a parallel interface, for example, MMC interface as described with reference to FIG. 1. Furthermore, the host interface 6431 may serve as a serial interface, for example, Ultra High Speed (UHS)-I and UHS-II interface.

FIGS. 12 to 15 are diagrams schematically illustrating other examples of the data processing system including the memory system in accordance with an embodiment. FIGS. 12 to 15 schematically illustrate universal flash storage (UFS) systems to which the memory system in accordance with an embodiment is applied.

Referring to FIGS. 12 to 15, the UFS systems 6500, 6600, 6700 and 6800 may include hosts 6510, 6610, 6710 and 6810, UFS devices 6520, 6620, 6720 and 6820 and UFS cards 6530, 6630, 6730 and 6830, respectively. The hosts 6510, 6610, 6710 and 6810 may serve as application processors of wired and/or wireless electronic devices or particularly mobile electronic devices, the UFS devices 6520, 6620, 6720 and 6820 may serve as embedded UFS devices.

The UFS cards 6530, 6630, 6730 and 6830 may serve as external embedded UFS devices or removable UFS cards.

The hosts 6510, 6610, 6710 and 6810, the UFS devices 6520, 6620, 6720 and 6820 and the UFS cards 6530, 6630, 6730 and 6830 in the respective UFS systems 6500, 6600, 6700 and 6800 may communicate with external devices, for example, wired and/or wireless electronic devices or particularly mobile electronic devices through UFS protocols. The UFS devices 6520, 6620, 6720 and 6820 and the UFS cards 6530, 6630, 6730 and 6830 may be embodied by the memory system 110 Illustrated in FIGS. 1 and 6. For example, in the UFS systems 6500, 6600, 6700 and 6800, the UFS devices 6520, 6620, 6720 and 6820 may be embodied in the form of the data processing system 6200, the SSD 6300 or the eMMC 6400 described with reference to FIGS. 9 to 11, and the UFS cards 6530, 6630, 6730 and 6830 may be embodied in the form of the memory card system 6100 described with reference to FIG. 8.

Furthermore, in the UFS systems 6500, 6600, 6700 and 6800, the hosts 6510, 6610, 6710 and 6810, the UFS devices 6520, 6620, 6720 and 6820 and the UFS cards 6530, 6630, 6730 and 6830 may communicate with each other through an UFS interface, for example, MIPI M-PHY and MIPI UniPro (Unified Protocol) in MIPI (Mobile Industry Processor Interface). Furthermore, the UFS devices 6520, 6620, 6720 and 6820 and the UFS cards 6530, 6630, 6730 and 6830 may communicate with each other through various protocols other than the UFS protocol, for example, universal storage bus (USB) Flash Drives (UFDs), multi-media card (MMC), secure digital (SD), mini-SD, and micro-SD.

Figure 12:
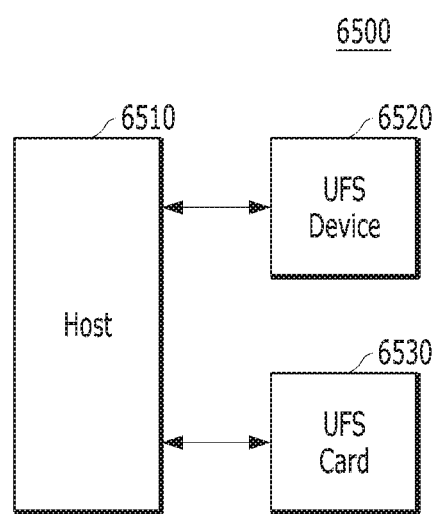

In the UFS system 6500 illustrated in FIG. 12, each of the host 6510, the UFS device 6520 and the UFS card 6530 may include UniPro.

The host 6510 may perform a switching operation in order to communicate with the UFS device 6520 and the UFS card 6530. In particular, the host 6510 may communicate with the UFS device 6520 or the UFS card 6530 through link layer switching, for example, L3 switching at the UniPro. At this time, the UFS device 6520 and the UFS card 6530 may communicate with each other through link layer switching at the UniPro of the host 6510. In the present embodiment, the configuration in which one UFS device 6520 and one UFS card 6530 are connected to the host 6510 has been exemplified for convenience of description. However, a plurality of UFS devices and UFS cards may be connected in parallel or in the form of a star to the host 6510, and a plurality of UFS cards may be connected in parallel or in the form of a star to the UFS device 6520 or connected in series or in the form of a chain to the UFS device 6520.

Figure 13:
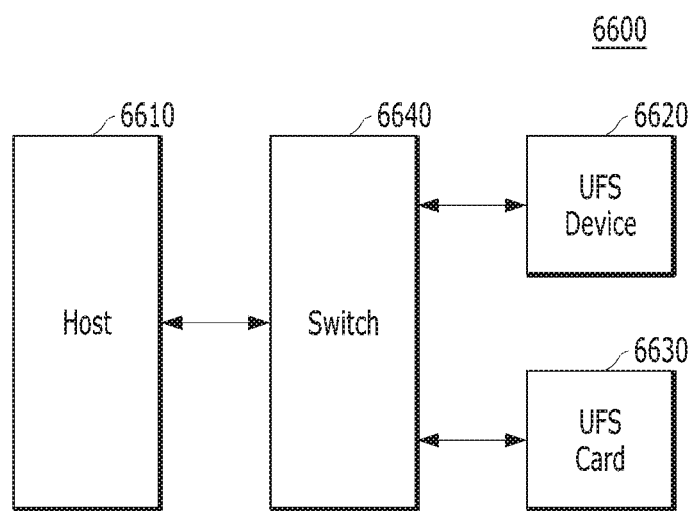

In the UFS system 6600 illustrated in FIG. 13, each of the host 6610, the UFS device 6620 and the UFS card 6630 may include UniPro, and the host 6610 may communicate with the UFS device 6620 or the UFS card 6630 through a switching module 6640 performing a switching operation, for example, through the switching module 6640 which performs link layer switching at the UniPro, for example, L3 switching. The UFS device 6620 and the UFS card 6630 may communicate with each other through link layer switching of the switching module 6640 at UniPro. In the present embodiment, the configuration in which one UFS device 6620 and one UFS card 6630 are connected to the switching module 6640 has been exemplified for convenience of description. However, a plurality of UFS devices and UFS cards may be connected in parallel or in the form of a star to the switching module 6640, and a plurality of UFS cards may be connected in series or in the form of a chain to the UFS device 6620.

Figure 14:
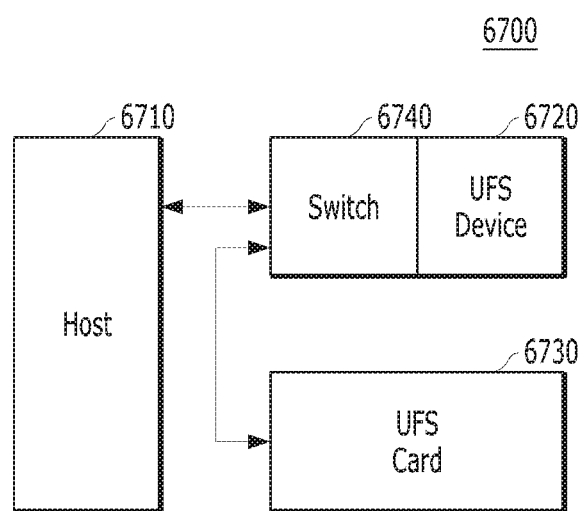

In the UFS system 6700 illustrated in FIG. 14, each of the host 6710, the UFS device 6720 and the UFS card 6730 may include UniPro. The host 6710 may communicate with the UFS device 6720 or the UFS card 6730 through a switching module 6740 performing a switching operation, for example, through the switching module 6740 which performs link layer switching at the UniPro, for example, L3 switching. At this time, the UFS device 6720 and the UFS card 6730 may communicate with each other through link layer switching of the switching module 6740 at the UniPro, and the switching module 6740 may be integrated as one module with the UFS device 6720 inside or outside the UFS device 6720. In the present embodiment, the configuration in which one UFS device 6720 and one UFS card 6730 are connected to the switching module 6740 has been exemplified for convenience of description. However, a plurality of modules each including the switching module 6740 and the UFS device 6720 may be connected in parallel or in the form of a star to the host 6710 or connected in series or in the form of a chain to each other. Furthermore, a plurality of UFS cards may be connected in parallel or in the form of a star to the UFS device 6720.

Figure 15:
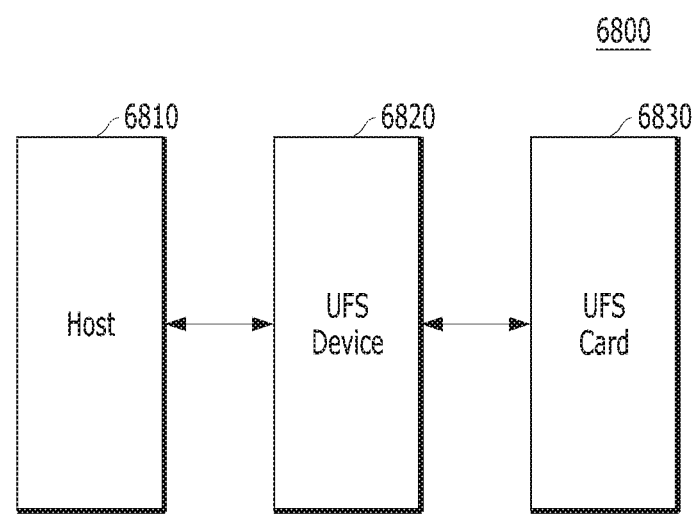

In the UFS system 6800 illustrated in FIG. 15, each of the host 6810, the UFS device 6820 and the UFS card 6830 may include M-PHY and UniPro. The UFS device 6820 may perform a switching operation in order to communicate with the host 6810 and the UFS card 6830. In particular, the UFS device 6820 may communicate with the host 6810 or the UFS card 6830 through a switching operation between the M-PHY and UniPro module for communication with the host 6810 and the M-PHY and UniPro module for communication with the UFS card 6830, for example, through a target Identifier (ID) switching operation. At this time, the host 6810 and the UFS card 6830 may communicate with each other through target ID switching between the M-PHY and UniPro modules of the UFS device 6820. In the present embodiment, the configuration in which one UFS device 6820 is connected to the host 6810 and one UFS card 6830 Is connected to the UFS device 6820 has been exemplified for convenience of description. However, a plurality of UFS devices may be connected in parallel or in the form of a star to the host 6810, or connected in series or in the form of a chain to the host 6810, and a plurality of UFS cards may be connected in parallel or in the form of a star to the UFS device 6820, or connected in series or in the form of a chain to the UFS device 6820.

Figure 16:
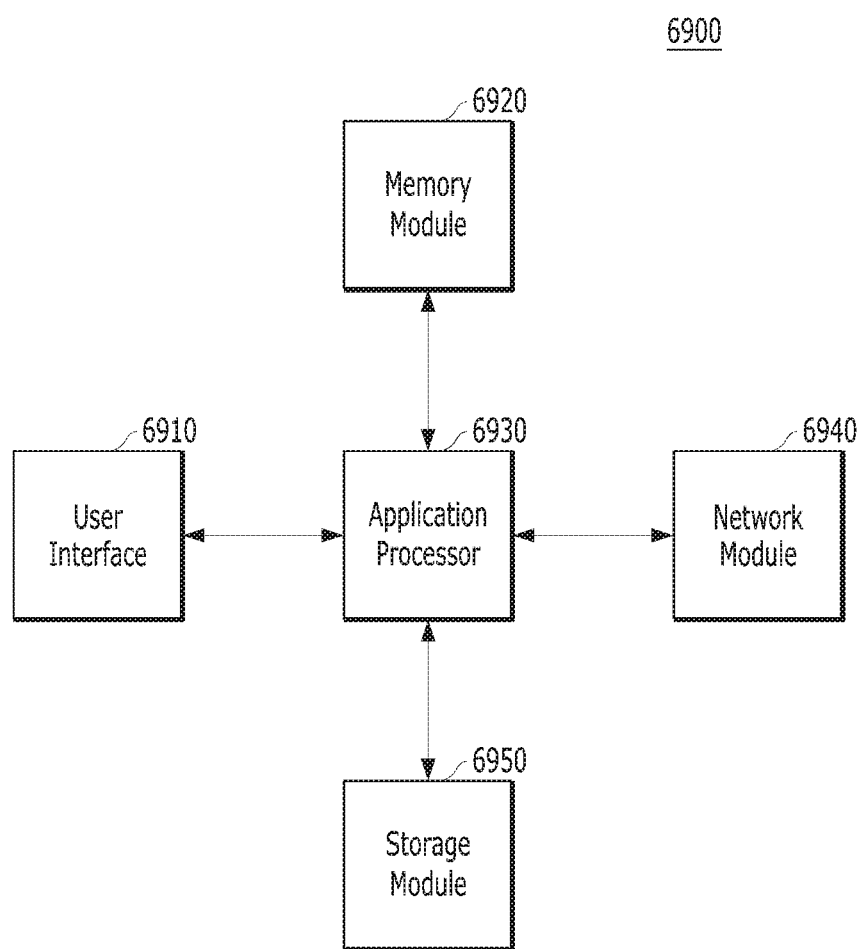

FIG. 16 is a diagram schematically illustrating another example of the data processing system including the memory system in accordance with an embodiment. FIG. 16 is a diagram schematically illustrating a user system 6900 to which the memory system in accordance with an embodiment is applied.

Referring to FIG. 16, the user system 6900 may include a user interface 6910, a memory module 6920, an application processor 6930, a network module 6940, and a storage module 6950.

More specifically, the application processor 6930 may drive components included in the user system 6900, for example, an operating system (OS), and include controllers, interfaces and a graphic engine which control the components included in the user system 6900. The application processor 6930 may be provided as a System-on-Chip (SoC).

The memory module 6920 may be used as a main memory, work memory, buffer memory or cache memory of the user system 6900. The memory module 6920 may include a volatile random access memory (RAM) such as a dynamic RAM (DRAM), a synchronous DRAM (SDRAM), a double data rate (DDR) SDRAM, DDR2 SDRAM, DDR3 SDRAM, LPDDR SDARM, LPDDR3 SDRAM or LPDDR3 SDRAM or a nonvolatile RAM such as a phase-change RAM (PRAM), a resistive RAM (ReRAM), a magneto-resistive RAM (MRAM) or a ferroelectric RAM (FRAM). For example, the application processor 6930 and the memory module 6920 may be packaged and mounted, based on Package on Package (PoP).

The network module 6940 may communicate with external devices. For example, the network module 6940 may not only support wired communication, but may also support various wireless communication protocols such as code division multiple access (CDMA), global system for mobile communication (GSM), wideband CDMA (WCDMA), CDMA-2000, time division multiple access (TDMA), long term evolution (LTE), worldwide interoperability for microwave access (Wimax), wireless local area network (WLAN), ultra-wideband (UWB), Bluetooth, wireless display (WI-DI), thereby communicating with wired/wireless electronic devices or particularly mobile electronic devices. Therefore, the memory system and the data processing system, in accordance with an embodiment of the present invention, can be applied to wired/wireless electronic devices. The network module 6940 may be included in the application processor 6930.

The storage module 6950 may store data, for example, data received from the application processor 6930, and then may transmit the stored data to the application processor 6930. The storage module 6950 may be embodied by a nonvolatile semiconductor memory device such as a phase-change RAM (PRAM), a magnetic RAM (MRAM), a resistive RAM (ReRAM), a NAND flash, NOR flash and 3D NAND flash, and provided as a removable storage medium such as a memory card or external drive of the user system 6900. The storage module 6950 may correspond to the memory system 110 described with reference to FIGS. 1 and 6. Furthermore, the storage module 6950 may be embodied as an SSD, eMMC and UFS as described above with reference to FIGS. 10 to 15.

The user interface 6910 may include interfaces for inputting data or commands to the application processor 6930 or outputting data to an external device. For example, the user interface 6910 may include user Input interfaces such as a keyboard, a keypad, a button, a touch panel, a touch screen, a touch pad, a touch ball, a camera, a microphone, a gyroscope sensor, a vibration sensor and a piezoelectric element, and user output interfaces such as a liquid crystal display (LCD), an organic light emitting diode (OLED) display device, an active matrix OLED (AMOLED) display device, an LED, a speaker and a motor.

Furthermore, when the memory system 110 of FIGS. 1 and 6 is applied to a mobile electronic device of the user system 6900, the application processor 6930 may control the operations of the mobile electronic device, and the network module 6940 may serve as a communication module for controlling wired and/or wireless communication with an external device. The user interface 6910 may display data processed by the processor 6930 on a display/touch module of the mobile electronic device, or support a function of receiving data from the touch panel.

According to the embodiments of the present invention, when a plurality of data including pointer values and key values that are managed in a tree structure are stored in a memory system, the pointer values on which are relatively often updated despite relatively small size may be stored in a first memory device which supports an overwriting operation, and the key values on which are not relatively often updated despite relatively large size may be stored in a second memory device which does not support the overwriting operation.

Consequently, the memory system may efficiently store the pointer values and key values of the data depending on their characteristics.

While the present invention has been described with respect to specific embodiments, it will be apparent to those skilled in the art that various changes and modifications may be made without departing from the spirit and scope of the invention as defined in the following claims.

What is claimed is:

1. A memory system comprising:
   a sudden power off (SPO) frequency value calculator suitable for determining a SPO frequency value;
   a checkpointing mode controller suitable for setting the memory system to one among a high frequency checkpointing mode and a low frequency checkpointing mode according to the SPO frequency value; and
   a processor suitable for performing a checkpointing operation according to the set frequency checkpointing mode.

2. The memory system of claim 1, wherein the checkpointing mode controller compares the SPO frequency value with a SPO frequency threshold value.

3. The memory system of claim 2, wherein the SPO frequency value calculator determines the SPO frequency value through a current value and a weighted value of respective calculation factors.

4. The memory system of claim 2, wherein the SPO frequency value calculator determines the SPO frequency threshold value through a threshold value and a weighted value of respective calculation factors.

5. The memory system of claim 2, wherein the checkpointing mode controller sets the memory system to the high frequency checkpointing mode when the SPO frequency value is greater than or equal to the SPO frequency threshold value.

6. The memory system of claim 2, wherein the checkpointing mode controller sets the memory system to the low frequency checkpointing mode when the SPO frequency value is less than the SPO frequency threshold value.

7. The memory system of claim 3, wherein the calculation factors include at least one of a user type, a memory device type, and a count of recently occurred SPOs.

8. An operating method of a memory system, the method comprising:
   determining, by a sudden power off (SPO) frequency value calculator, a SPO frequency value;
   setting, by a checkpointing mode controller, the memory system to one among a high frequency checkpointing mode and a low frequency checkpointing mode according to the SPO frequency value; and
   performing, by a processor, a checkpointing operation according to the set frequency checkpointing mode.

9. The method of claim 8, further comprising comparing the SPO frequency value with a SPO frequency threshold value.

10. The method of claim 9, wherein the determining of the SPO frequency value is performed through a current value and a weighted value of respective calculation factors.

11. The method of claim 9, wherein the determining of the SPO frequency value is performed through a threshold value and a weighted value of respective calculation factors.

12. The method of claim 9, wherein the setting of the memory system includes setting the memory system to the high frequency checkpointing mode when the SPO frequency value is greater than or equal to the SPO frequency threshold value.

13. The method of claim 9, wherein the setting of the memory system includes setting the memory system to the low frequency checkpointing mode when the SPO frequency value is less than the SPO frequency threshold value.

14. The method of claim 10, wherein the calculation factors include at least one of a user type, a memory device type, and a count of recently occurred SPOs.

15. A memory system, comprising:
   a memory device; and
   a controller suitable for determining an operation mode of the memory system based on an occurrence number of sudden power offs (SPOs) and a type of the memory device, and backing up information required to boot based on the determined operation mode.

16. The memory system of claim 15, wherein the controller comprises:
   a SPO frequency value calculator suitable for determining a SPO frequency value as the occurrence number of SPOs based on the occurrence number of SPOs and the type of the memory device;
   a mode controller suitable for selecting one mode of a high frequency mode and a low frequency mode based on the determined SPO frequency value, and determining the selected one mode as the operation mode; and
   a processor suitable for backing up the information based on the operation mode.

17. The memory system of claim 16, wherein the mode controller compares the SPO frequency value with a threshold value, and selects one of both the high frequency mode and the low frequency mode based on the comparison result as the operation mode.

18. The memory system of claim 17, wherein the mode controller selects the high frequency mode to increase a current frequency for the backing up of the information when the SPO frequency value is greater than or equal to the threshold value.

19. The memory system of claim 17, wherein the mode controller selects the low frequency mode to decrease a current frequency for the backing up of the information when the SPO frequency value is less than the threshold value.

* * * * *